(12) United States Patent
Mottahed

(10) Patent No.: US 6,493,224 B1
(45) Date of Patent: Dec. 10, 2002

(54) METHOD AND APPARATUS TO INCREASE CONVECTION HEAT TRANSFER IN AN ELECTRICAL SYSTEM AND A METHOD OF MANUFACTURING THE SAME

(75) Inventor: Behzad D. Mottahed, Upper Montclair, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/634,497

(22) Filed: Aug. 8, 2000

(51) Int. Cl.⁷ ................................................. H05K 7/20
(52) U.S. Cl. ........................ 361/692; 165/129; 219/209; 454/184; 361/719
(58) Field of Search .................... 312/236; 257/722; 124/16.1, 16.3; 219/400, 209, 385; 454/43, 184; 165/80.3, DIG. 37, 128, 129; 361/689, 690, 692, 693, 703, 717–719

(56) References Cited

U.S. PATENT DOCUMENTS

| | | | | |
|---|---|---|---|---|
| 4,177,499 A | * | 12/1979 | Volkmann | 361/710 |
| 4,241,380 A | * | 12/1980 | Lehmann et al. | 361/690 |
| 5,486,681 A | * | 1/1996 | Dagnac et al. | 219/400 |
| 6,141,495 A | * | 10/2000 | Roth | 392/363 |
| 6,157,897 A | * | 12/2000 | Yoshikawa | 702/132 |
| 6,201,221 B1 | | 3/2001 | LaGrotta et al. | |

FOREIGN PATENT DOCUMENTS

JP            07147492        6/1995

* cited by examiner

Primary Examiner—Gerald Tolin
(74) Attorney, Agent, or Firm—Harness, Dickey & Pierce, P.L.C.

(57) ABSTRACT

Disclosed is a method and apparatus to increase convection heat transfer in an electrical system. The increase in convection heat transfer is achieved by applying a heat source in the vicinity of an electronic element. This effectively increases the amount of airflow across the electronic element.

8 Claims, 3 Drawing Sheets

METHOD AND APPARATUS TO INCREASE CONVECTION HEAT TRANSFER IN AN ELECTRICAL SYSTEM AND A METHOD OF MANUFACTURING THE SAME

BACKGROUND OF THE INVENTION

1. Field of the Invention

The present invention relates to methods and apparatus for promoting heat transfer. More particularly, the present invention relates to methods and apparatus for promoting an increase of convection heat transfer in systems employing electronic components.

2. Description of Related Art

As integrated circuit packages and devices have become smaller, with shorter circuit traces and increased internal signal speeds, greater power density has resulted, causing increased heating of the devices and a need for improved heat sinking and better thermal management.

A few methods and/or apparatus are commonly employed for providing such thermal management. Some of those include: heat conduction, where through a material, such as aluminum, heat flows from a warmer temperature to a cooler temperature; natural convection, which relies on airflow for cooling without any external forces applied to the air; forced convection where fans or blowers move air in a direction parallel to the surface of an element from which heat is being removed; and impingement cooling where the air is blown at the element to be cooled in a direction perpendicular to its surface.

Although not required, often, heat sinks are provided with each of the above methods and/or apparatus to improve the removal of heat from the element. Commonly, cooling fins or vanes are employed with the heat sinks for this purpose. Each of the indicated methods and/or apparatus for cooling has a disadvantage when implemented with today's ultra dense and sensitive integrated circuits and/or electronic devices. The heat produced by current integrated circuits can reach staggering temperature levels. Accordingly, a conventional heat sink, which relies solely upon convection heat transfer, is incapable of property cooling, and therefore, maintaining such integrated circuits at an acceptable operational temperature.

Forced convection and impingement cooling are capable of overcoming the deficiency of natural convection heat transfer. Specifically, each of forced convection and impingement cooling implements an air moving device to increase the mass flow of air across the element. This requires the installation of a fan and a predetermined supply voltage for operating the fan. The larger the increase in mass flow of air that is desired, the higher capacity fan and/or the larger the supply voltage. However, even if the element is to be cooled with a minimally sized fan, which requires a very small supply voltage, the acoustic signature of the fan may disrupt the desired operational characteristics of the integrated circuit being cooled. In many situations such a disruption in the operational characteristics of the integrated circuit is unacceptable.

SUMMARY OF THE INVENTION

The present invention provides a novel method and apparatus to increase convection heat transfer in an electrical system. The increase in convection heat transfer is achieved by introducing a heat source in the vicinity of an element to be cooled, thereby increasing convection heat transfer, i.e. increasing the amount of airflow across the element.

In addition, according to the present invention, a novel method of manufacturing an apparatus to increase convection heat transfer in an electronic system is provided. The method of manufacture includes the use of an electronic device, which is. preferably cooled using a heat source and an optional heat sink. The heat source is used to increase the convection heat transfer.

BRIEF DESCRIPTION OF THE DRAWINGS

The present invention will become more fully understood from the detailed description given hereinbelow and the accompanying drawings which are given by way of illustration only and thus are not limitative of the present invention, and wherein.

DETAILED DESCRIPTION

Figure 1:
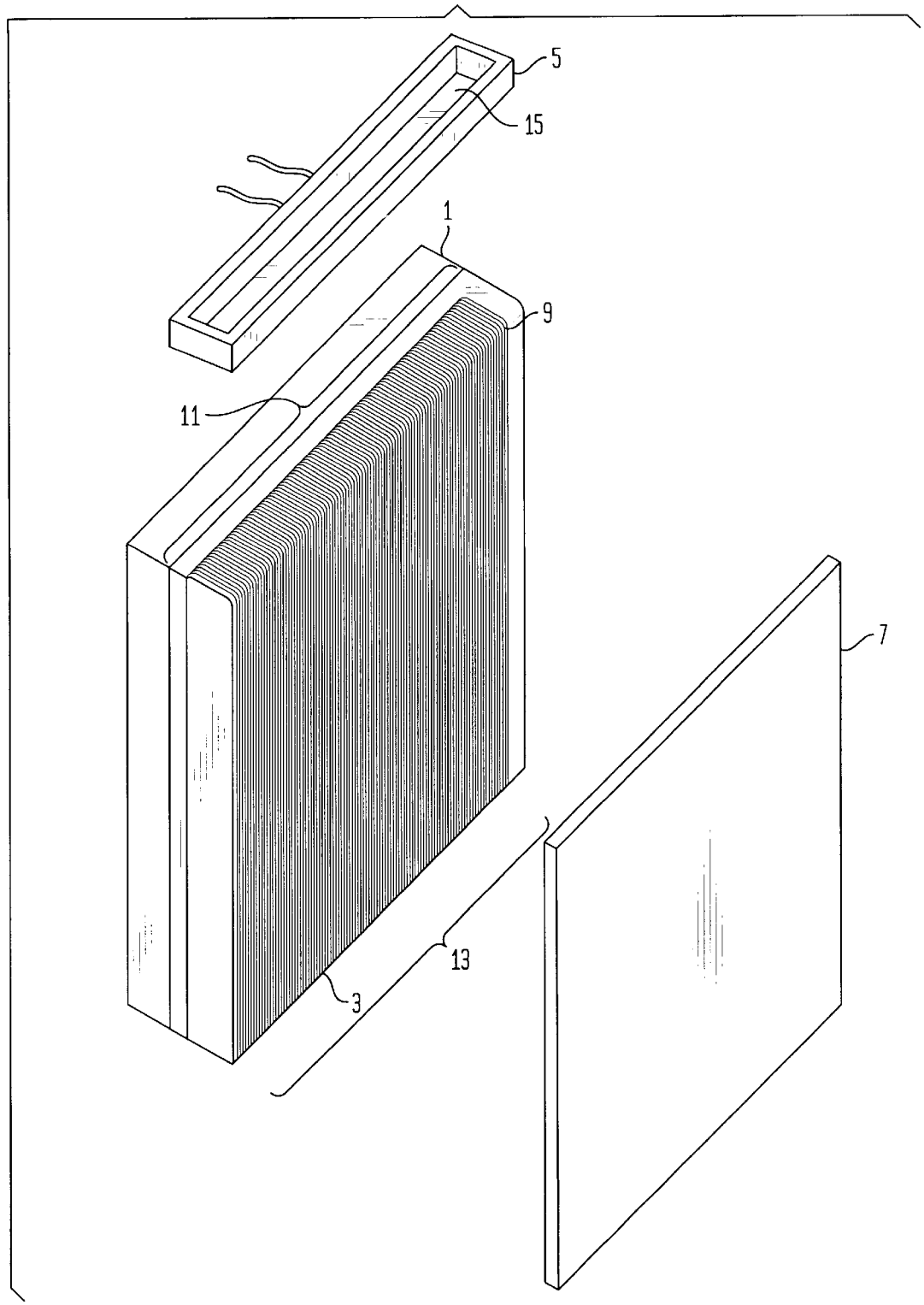
FIG. 1 is a perspective view of various structural elements which may be used to accomplish the method of the present invention.

FIG. 1 is a perspective view of various structural elements which may be used to accomplish the method and apparatus of the present invention. However, it should be readily understood from the following description that the elements shown in FIG. 1 are intended to be merely illustrative of the principles of the present invention, and should not be construed as limiting.

As seen in FIG. 1, the illustrated device includes an electrical device 1. This electrical device 1 may be, but is not limited to, an integrated circuit (e.g. a microprocessor or the like). In order to promote convection heat transfer away from the electrical device 1, a heat sink 3 is attached to a surface of the electrical device 1. The heat sink 3 is attached to the electrical device 1 using a heat conducting material to thereby promote even heat transfer from the electrical device 1 to the heat sink 3. The use of such a heat conducting material is useful to maximize a high efficiency thermal interface between the electrical device 1 and the heat sink 3.

As is further seen in FIG. 1, the illustrated device further includes a cover 7 attached to a top surface of the heat sink 3. In particular, the cover 7 is attached to the top edges of vanes 9. The vanes 9 of the heat sink are relatively thin vertical members, which extend from a base of the heat sink 3. These vanes 9 are often made of a metal material, however, they may also be made of another heat conducting material. The cover 7 attached to the vanes 9 creates a plurality of enclosed lengthwise passages. The cover 7 is preferably a metal plate. Each of the lengthwise passages is defined between two consecutive vanes 9. The lengthwise passages have openings 11 and 13 at top and bottom edges of the device, respectively. These passages are for promoting convection heat transfer. During the convection heat transfer air will enter the passages through one of the openings 11 and 13 and then exit the passages via one of the openings 11 and 13. For example, if the air enters the passages via opening 13, then it will exit the passages via opening 11.

A heat source 5 is then attached to one of the edges of the device, along either of the openings 11 and 13. The heat source 5 has a through opening 15 to thereby ensure that airflow through the lengthwise passages is uninhibited. The heat source may be a heating device that converts electric current to heat by means of resistors that emit radiant energy. Resistors may be composed of metal-alloy wire, nonmetallic carbon compounds, or printed circuits. Heating elements may have exposed resistor coils mounted on insulators, metallic resistors embedded in refractory insulation and encased in protective metal, or a printed circuit encased in glass. Alternatively, the heat source 5 may be another conventional device used for generating heat.

Figure 2:
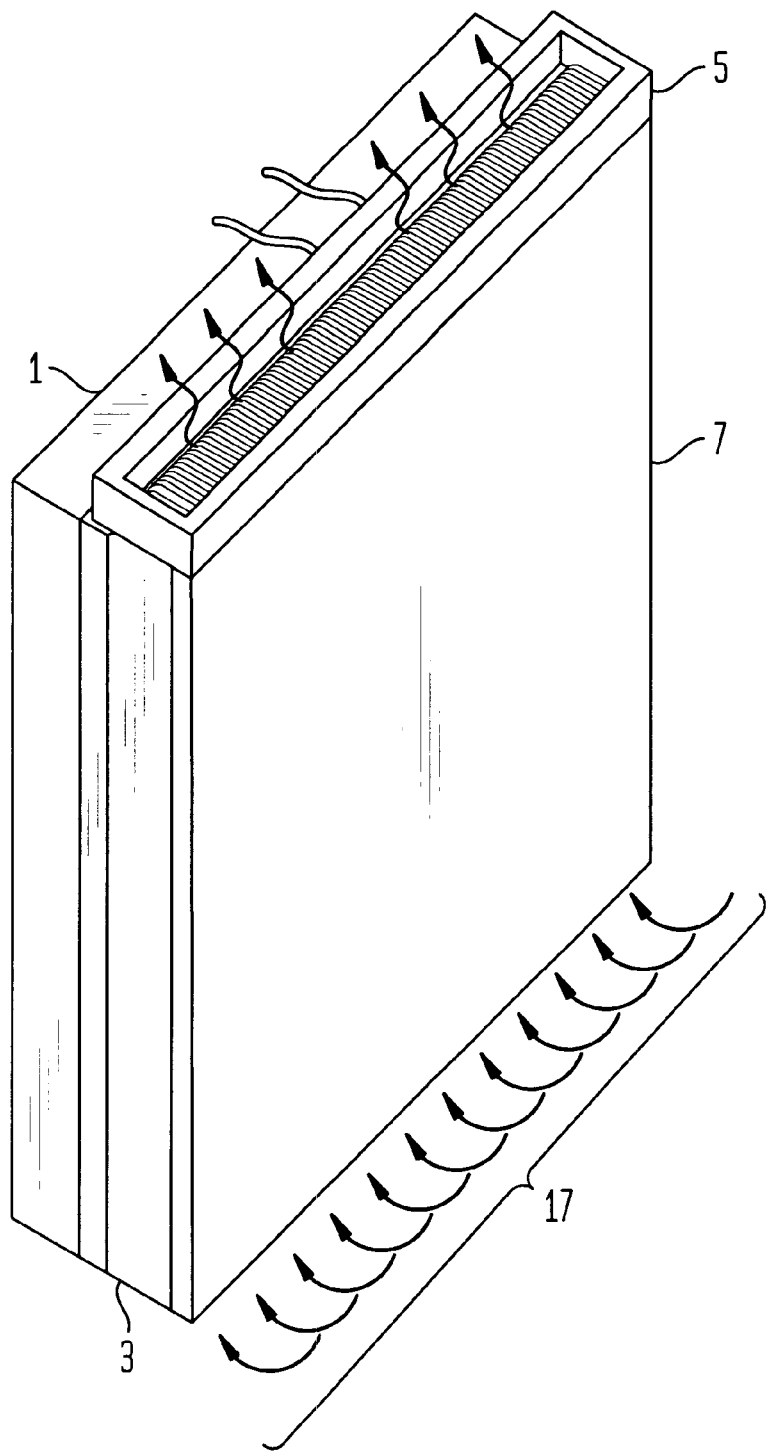
FIG. 2 is a perspective view of the same structural elements illustrated in FIG. 1, but in assembled form.

As is shown in FIG. 2, activation of the heat source 5 creates an increase of an input airflow 17 through the plurality of passages formed by the vanes 9, the cover 7 and the heat source 5. The input airflow 17 passing between the plurality of passages effectively cools the vanes 9, thereby indirectly cooling the electronic device 1. The input airflow 17 is exhausted form the device via the plurality of passages and the through passage 15.

Alternatively, the heat source 5 may be used with an electronic device 1, which does not employ a heat sink 3 and a cover 7. In this case, the heat source 5 may be used in the vicinity of the electronic device 1 to enhance heat transfer. However, care should be taken to ensure the heat source 5 does not increase the temperature of the electronic device 1.

Figure 3:
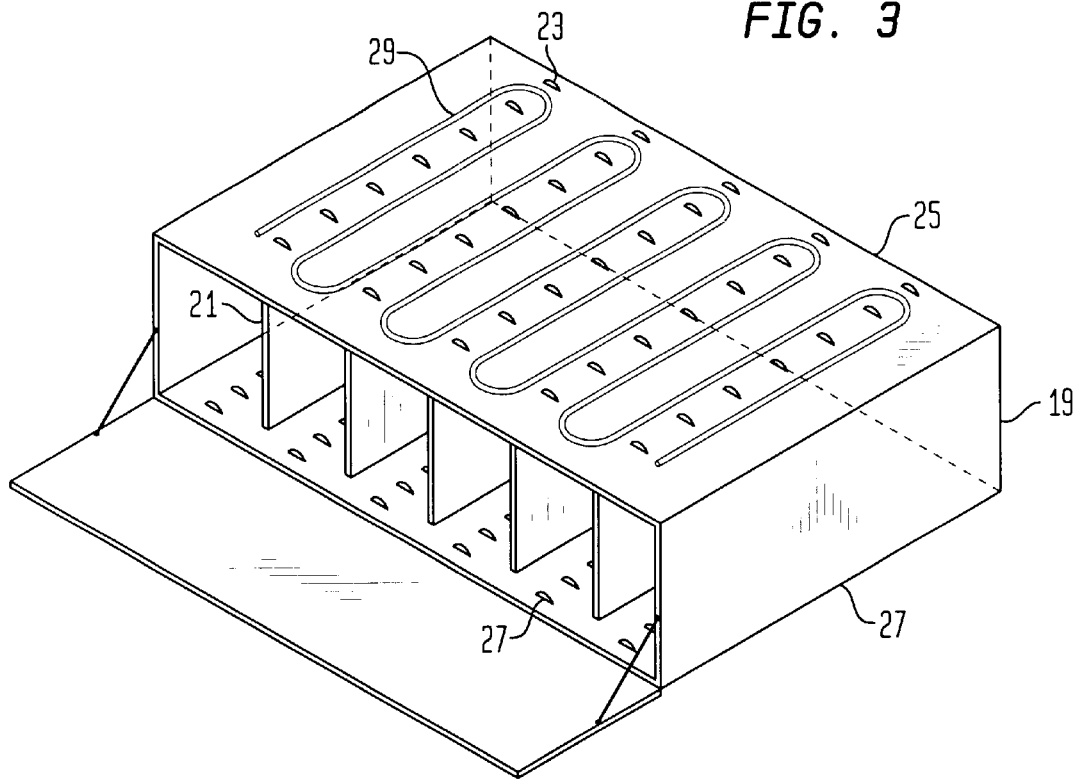
FIG. 3 is a perspective view of an electronics enclosure employing the method according to the present invention.

Another embodiment according to the principles of the present invention is shown in FIG. 3. FIG. 3 illustrates an electronics enclosure 19 having a plurality of circuit boards 21 contained therein. Vents or air passages 23 are integrated in a top 25 and bottom 27 of the enclosure 19. A heat source 29 is placed in the vicinity of the top 25, and preferably, directly on the top 25. The heat source 29 may be a heating device of the same type described hereinabove. As an example, the heat source 29 may formed having a meandering (having a winding or turning structure) or matrix structure, such that the air passages 23 are left exposed. The heat source 29 depicted in FIG. 3 has a meandering structure. Several heat sources may also be used if desired. For example, heat sources may be placed near or in the passages; however, care must be taken to ensure that the temperature element to be cooled is not increased. Moreover, the placement of the air passages 23 in the figures is for illustration only. For example, the air passages 23 may be placed in other locations on the electronics enclosure 19, while still achieving the objects of the present invention.

Figure 4:
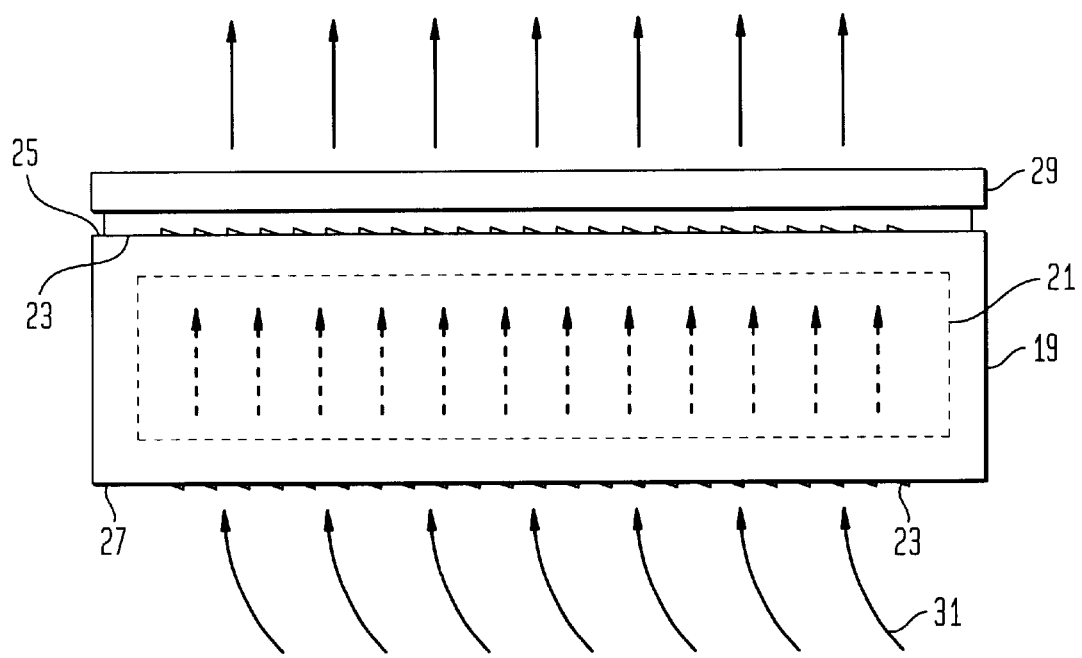
FIG. 4 illustrates a side view of the electronics enclosure depicted in FIG. 3.

FIG. 4 illustrates a side view of the electronics enclosure 19 depicted in FIG. 3. The rectangular broken-line figure shown within the confines of the electronics enclosure 19 is one of the plurality of circuit boards 21 depicted in FIG. 3. FIG. 4 further illustrates heat source 29, which is applied to the top 25 of the electronics enclosure 19. When the heat source 29 is operational an airflow 31, which passes through the air passages 23 in the bottom 27, increases. The airflow 31 flows past the circuit boards 21 and reduces the temperature of the circuit boards 21 and any component disposed thereon. Specifically, the airflow 31 flows between the plurality of circuit boards 21. The airflow 31 then exits the electronics enclosure 19 via the air passages 23 and passes through the openings in the heat source's 29 meandering or matrix structure.

While the enclosure 19 shown in the figures has multiple passages, defined by multiple circuit boards, the illustration thereof is merely illustrative. For example, heat producing elements disposed within a single passage may also be cooled using the method of the present invention. Specifically, vents located in the vicinity of the top and bottom of a passage, and a heat source applied to the vicinity of the top vents, will effectively reduce the temperature of the elements.

The devices shown in the figures have been depicted using individual elements, which are combined to implement the present invention. However, is should be readily understood that the devices depicted may be constructed as integral units when manufactured.

Additionally, the present invention has been illustrated and described using devices having a relatively small size. However, the method according the present invention is also applicable to larger scale applications. For example, an expansive ventilated enclosure (e.g. a room having heat sensitive equipment) may be cooled using the method of the present invention. In particular, using vents in a floor and roof and the addition of a heat source in the vicinity of the roof will increase a mass airflow through the room, thereby cooling any equipment contained in the room.

According to the principles of the present invention, the novel method disclosed hereinabove significantly increases the transfer of heat away from the electronic device 1 and/or electronics enclosure 19. For example, as is seen in FIGS. 1 and 2, the use of the heat source 5 results in an increase in the heat transfer coefficients by about 50%. The significant increase in heat transfer coefficients is a result of an increase in the temperature gradient from the top to the bottom of the device (or bottom to the top if the heat source 5 is attached to the bottom of the electronic device 1). However, because heat naturally rises, it is preferable to position the heat source 5 in the vicinity of the top of the device, thereby increasing the transfer of heat away from the device.

The invention thus being described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. An electrical system, comprising:
   an electronic device having at least one electronic component;
   a heat sink attached to the electronic device, the heat sink including vanes extending in a direction from a first end to a second end, the vanes defining through passages in the direction;
   an independent heat source, separate from the electronic device and having a heating function independent of a function of the electronic device, the heat source being disposed at the second end of the heat sink to apply heat at the second end and increase a cooling airflow in said direction through the through passages.

2. The apparatus of claim 1, wherein the heat source has an opening through which the cooling airflow can pass.

3. The apparatus of claim 2, wherein the heat source has a hollow rectangular shape.

4. The apparatus of claim 1, wherein the heat source converts electrical energy into heat.

5. The apparatus of claim 1, further comprising:

a cover disposed over the vanes of the heat sink.

6. An electrical system, comprising:

an enclosure having vents formed in a first wall and in a second wall of the enclosure the first and second walls of the enclosure opposing each other:

an electronic device housed within the enclosure;

a heating element disposed on the first wall and not the second wall the heating element being a strip that traverses between at least two of the vents in the first wall to apply heat and increase a cooling airflow from the vents in the second wall through the vents in the first wall.

7. The electrical system of claim 6, wherein the enclosure includes a first set of vents in the first wall arrayed in a first direction, and a second set of vents arrayed in the first wall parallel to the first set of vents; and wherein the heating element runs between the first and second sets of vents.

8. The electrical system of claim 7, wherein the heating element runs between two vents in the first set of vents.

* * * * *